(12) United States Patent
Okabe

(10) Patent No.: US 6,530,030 B1
(45) Date of Patent: Mar. 4, 2003

(54) APPARATUS FOR AND A METHOD OF CLOCK TREE SYNTHESIS ALLOCATION WIRING

(75) Inventor: Kazuhiro Okabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/500,632

(22) Filed: Feb. 9, 2000

(30) Foreign Application Priority Data

Feb. 16, 1999 (JP) ............................................. 11-037021

(51) Int. Cl.⁷ .............................. G06F 1/04; G06F 1/06; G06F 1/10
(52) U.S. Cl. ....................... 713/500; 713/501; 713/503; 716/1; 716/6; 716/10
(58) Field of Search ................................ 713/500, 501, 713/503; 716/1, 6, 10

(56) References Cited

U.S. PATENT DOCUMENTS

| | | | |
|---|---|---|---|
| 5,737,580 A | * 4/1998 | Hathaway et al. | 716/12 |
| 6,024,478 A | 2/2000 | Yamamoto | 364/488 |
| 6,053,950 A | * 4/2000 | Shinagawa | 716/2 |
| 6,092,211 A | * 7/2000 | Hozumi | 713/500 |
| 6,266,803 B1 | * 7/2001 | Scherer et al. | 716/12 |
| 6,321,364 B1 | * 11/2001 | Hirata | 716/5 |

FOREIGN PATENT DOCUMENTS

DE  197 04 658 A1  12/1997

* cited by examiner

*Primary Examiner*—Thomas Lee
*Assistant Examiner*—Paul B. Yanchus, III
(74) *Attorney, Agent, or Firm*—Foley & Lardner

(57) ABSTRACT

In an apparatus for clock tree synthesis allocation wiring, the wiring is appropriately conducting while minimizing the wiring cost and power consumed in operation. A first file stores therein information of operating frequencies of clock lines. Second file stores therein information of a maximum capacity allowed for a clock buffer for each operating frequency obtained according to restriction of electro-migration. A maximum capacity determining device determines a maximum capacity allowed for an operating frequency according to information of the operating frequency from the input device, information of the operating frequencies stored in the first file, and information of the maximum capacity stored in the second file. A tool for clock tree synthesis allocation wiring conducts wiring by assuming the maximum capacity to be a limiting value of a maximum capacity which can be added to each clock buffer.

6 Claims, 3 Drawing Sheets

APPARATUS FOR AND A METHOD OF CLOCK TREE SYNTHESIS ALLOCATION WIRING

BACKGROUND OF THE INVENTION

The present invention relates to a an apparatus for and a method of clock tree synthesis allocation wiring in which clock buffers are wired to each other in a tree form to distribute a clock signal.

Description of the Prior Art

In the application specific integrated circuits (ASIC) of 0.5 micron generation, the wiring has a width of about 0.85 micron to about 0.96 micron, a film thickness of about 8000 angstrom (Å) to about 10000 Å, and a via size of about 0.8 micron. Additionally, these integrated circuits have a relatively low user system frequency, i.e., a maximum value of about 70 megaherz (MHz). In the clock tree allocation wiring with a fixed line width, even a capacity value which guarantees electro-migration at an available maximum frequency is set to as a maximum capacity value which can be added to a clock buffer, the capacity of the restriction value is large, i.e., about several picofarad (pF) when it is assumed that the wiring is conducted with a minimum wiring width. Consequently, there does not particularly arise any problem.

However, the system frequency has been considerably increased, for example, the integrated circuits of 0.35 micron rule generation have a maximum system frequency of about 150 MHz and those of 0.25 micron rule generation have a maximum system frequency of about 200 MHz. On the other hand, according to the 0.35 micron rule, the aluminum line width is about 0.65 micron to about 0.75 micron, the aluminum film thickness is about 6000 Å to about 7000 Å, and the via size is about 0.6 micron. In the integrated circuits of the 0.25 micron rule, the aluminum line width is about 0.4 micron to about 0.5 micron, the aluminum film thickness is about 4000 Å to about 5000 Å, and the via size is about 0.4 micron. In the clock tree allocation wiring with a fixed line width, to guarantee strength against electro-migration at a maximum allowable system frequency, if the wiring is assumed to be achieved with a minimum wiring width when the capacity value is fixed as in the prior art, the maximum capacity value which can be added to the clock buffer is reduced to a small value, namely, about 1 pF in the 0.35 micron generation and about 0.5 pF in the 0.25 micron generation. This is a very strict restriction for the users who desire to operate such integrated circuits at a low frequency. This increases the number of clock stages in the clock tree allocation wiring and resultantly leads to a problem of deterioration in performance, increase in consumption of operating power, and increase in production cost.

To solve the problem, when the pitch is doubled for the line width, the restriction of capacity is relieved. However, the wiring grid is doubled when compared with the circuit layout using the minimum line width. There consequently arises a new problem of great deterioration in efficiency of wiring. As another way of removing the problem, it may also be possible that a clock tree allocation wiring is provided to mitigate the limiting value of the capacity. Thereafter, a check is made to confirm whether or not the strength against electro-migration is guaranteed. At any position where the strength is not guaranteed, a new buffer is inserted to limit the capacity which is added to the buffer to thereby retain necessary reliability. However, due to insertion of buffers, there arises a new problem that the requirement of equal delay in all tree paths cannot be satisfied, namely, the delay value varies between a position with the additional buffer and a position without the buffer.

SUMMARY OF THE INVENTION

It is therefore an object of the present invention to provide an apparatus for and a method of clock tree synthesis allocation wiring in which the wiring is appropriately achieved, the wiring cost is reduced, and the power consumption is minimized in operation.

To solve the problem above in accordance with a first aspect of the present invention, there is provided an apparatus for clock tree synthesis allocation wiring comprising a storage including a first file in which information of operating frequencies of clock lines is stored and a second file in which information of a maximum capacity allowed for a clock buffer for each operating frequency obtained according to restriction of electro-migration is stored, a maximum capacity determining a device connected to the storage, an input device for inputting therefrom to the maximum capacity determining device information of operating frequencies to be used, and a tool for clock tree synthesis allocation wiring connected to the maximum capacity determining device. The maximum capacity determining device determines a maximum available capacity allowed for each of the operating frequencies according to information of the operating frequency from the input device, information of the operating frequencies stored in the first file, and information of the maximum capacity stored in the second file. The wiring tool conducts wiring by assuming the maximum available capacity to be a limiting value of a maximum capacity which can be added to each clock buffer.

In accordance with a second aspect of the present invention, there is provided an apparatus for clock tree synthesis allocation wiring, comprising a storage including a first file in which information of operating frequencies of clock lines is stored and a second file in which information of a maximum capacity allowed for a clock buffer for each operating frequency obtained according to restriction of hot carrier degradation is stored, a maximum capacity determining device connected to the storage, an input device for inputting therefrom to the maximum capacity determining device information of operating frequencies to be used, and a tool for clock tree synthesis allocation wiring connected to the maximum capacity determining device. The maximum capacity determines device determining a maximum available capacity allowed for each of the operating frequencies according to information of the operating frequency from the input device, information of the operating frequencies stored in the first file, and information of the maximum capacity stored in the second file. The wiring tool conducts wiring by assuming the maximum available capacity to be a limiting value of a maximum capacity which can be added to each clock buffer.

In accordance with a third aspect of the present invention, there is provided an apparatus for clock tree synthesis allocation wiring, comprising a storage including a first file in which information of operating frequencies of clock lines is stored, a second file in which information of a maximum capacity allowed for a clock buffer for each operating frequency obtained according to restriction of electro-migration is stored, and a third file in which information of a maximum capacity allowed for a clock buffer for each operating frequency obtained according to restriction of hot carrier degradation is stored, a maximum capacity determining device connected to the storage, an input device for inputting therefrom to the maximum capacity determining device information of operating frequencies to be used, and a tool for clock tree synthesis allocation wiring connected to the maximum capacity determining device. The maximum capacity determines device determining a maximum available capacity allowed for each of the operating frequencies according to information of the operating frequency from the input device, information of the operating frequencies stored in the first file, and information of the maximum capacity stored in the second and third files. The wiring tool conducting wiring by assuming the maximum available capacity to be a limiting value of a maximum capacity which can be added to each clock buffer.

In accordance with a fourth aspect of the present invention, there is provided a method of clock tree synthesis allocation wiring for use with an apparatus for clock tree synthesis allocation wiring, the apparatus comprising a storage including a first file in which information of operating frequencies of clock lines is stored and a second file in which information of a maximum capacity allowed for a clock buffer for each operating frequency obtained according to restriction of electro-migration is stored, a maximum capacity determining device connected to the storage, an input device for inputting therefrom in the maximum capacity determining device information of operating frequencies to be used, and a tool for clock tree synthesis allocation wiring connected to the maximum capacity determining device. The method comprises the steps of inputting by the input device information of operating frequencies to be used, to the maximum capacity determining device, determining by the maximum capacity determining device a maximum available capacity allowed for each of the operating frequencies according to information of the operating frequency from the input device, information of the operating frequencies stored in the first file, and information of the maximum capacity stored in the second file, and wiring by the wiring tool by assuming the maximum available capacity to be a limiting value of a maximum capacity which can be added to each clock buffer.

In accordance with a fifth aspect of the present invention, there is provided a method of clock tree synthesis allocation wiring for use with an apparatus for clock tree synthesis allocation wiring, the apparatus comprising a storage including a first file in which information of operating frequencies of clock lines is stored and a second file in which information of a maximum capacity allowed for a clock buffer for each operating frequency obtained according to restriction of hot carrier degradation is stored, a maximum capacity determining device connected to the storage, an input device for inputting therefrom in the maximum capacity determining device information of operating frequencies to be used, and a tool for clock tree synthesis allocation wiring connected to the maximum capacity determining device. The method comprises the steps of inputting by the input device information of operating frequencies to be used, to the maximum capacity determining device, determining by the maximum capacity determining device a maximum available capacity allowed for each of the operating frequencies according to information of the operating frequency from the input device, information of the operating frequencies stored in the first file, and information of the maximum capacity stored in the second file, and wiring by the wiring tool by assuming the maximum available capacity to be a limiting value of a maximum capacity which can be added to each clock buffer.

In accordance with a sixth aspect of the present invention, there is provided a method of clock tree synthesis allocation wiring for use with an apparatus for clock tree synthesis allocation wiring, the apparatus comprising a storage including a first file in which information of operating frequencies of clock lines is stored, a second file in which information of a maximum capacity allowed for a clock buffer for each operating frequency obtained according to restriction of electro-migration is stored, and a third file in which information of a maximum capacity allowed for a clock buffer for each operating frequency obtained according to restriction of hot carrier degradation is stored, a maximum capacity determining device connected to the storage, an input device for inputting therefrom in the maximum capacity determining device information of operating frequencies to be used, and a tool for clock tree synthesis allocation wiring connected to the maximum capacity determining device. The method comprises the steps of inputting by the input device information of operating frequencies to be used, to the maximum capacity determining device, determining by the maximum capacity determining device a maximum available capacity allowed for each of the operating frequencies according to information of the operating frequency from the input device, information of the operating frequencies stored in the first file, and information of the maximum capacity stored in the second and third files, and wiring by the wiring tool by assuming the maximum available capacity to be a limiting value of a maximum capacity which can be added to each clock buffer.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring next to the drawings, description will be given of an embodiment of the present invention.

Figure 1:
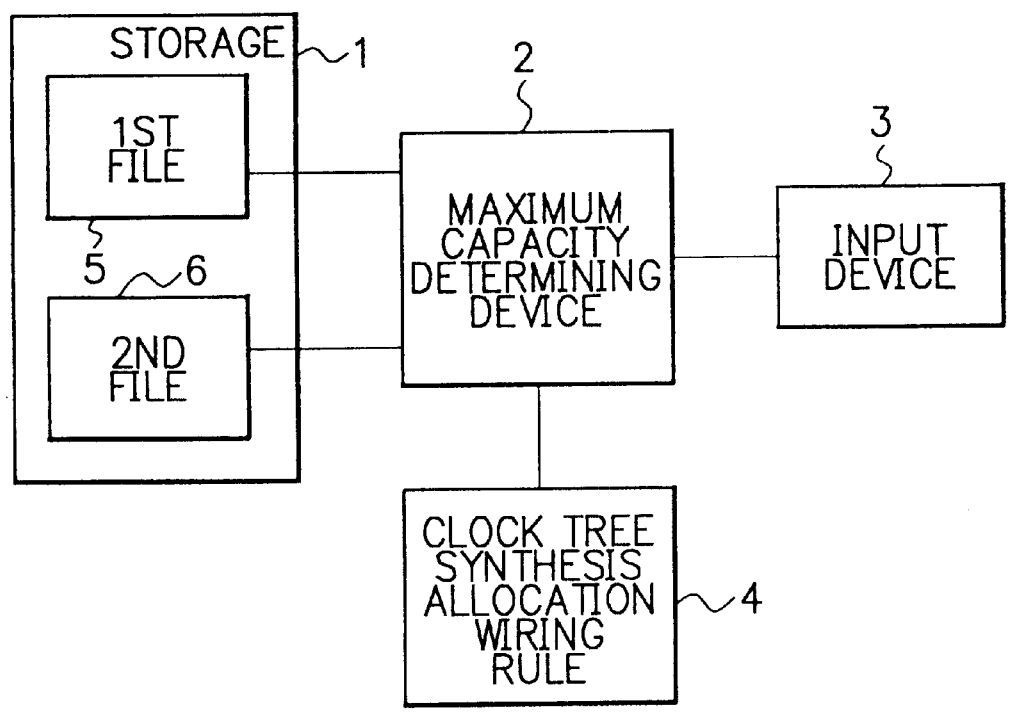
FIG. 1 is a block diagram showing a first embodiment of an apparatus for clock tree synthesis allocation wiring in accordance with the present invention.

FIG. 1 shows in a block diagram a first embodiment of an apparatus for clock tree synthesis allocation wiring in accordance with the present invention. The apparatus includes a storage 1, a maximum capacity determining device 2, an input device 3, and a tool for clock tree synthesis allocation wiring 4. Device 2 is connected to storage 1. Input device 3 and tool 4 are linked with device 2.

Storage 1 includes a first file 5 and a second file 6. First file 5 stores therein information of operating frequencies of clock lines. Second file 6 stores therein, for each operating frequency obtained according to restriction of electro-migration, information of a maximum capacity for a clock buffer. Input device 3 is used by an operator to input to maximum capacity determining device 2 information of an operating frequency to be used. Device 2 determines a maximum available capacity for the operating frequency according to information of the operating frequency from input device 3, information of the operating frequency stored in first file 5, and information of the maximum capacity stored in second file 6. Wiring tool 4 conducts wiring by assuming that the maximum available capacity determined by device 2 is the limiting value of the maximum capacity which can be added to each buffer.

First file 5 is generated by storing in storage 1 information of operating frequencies of clock lines, the frequencies being specified by a designer in a circuit designing phase. Second file 6 is created as follows. When a reliability guarantee period requested by a circuit or a system is determined, a quantity of current I allowed to be flown can be uniquely determined for each wiring width used in the clock tree synthesis wiring in accordance with a quality guarantee formula. For example, to simply calculate a maximum limiting capacity, there exists a relation of $I=CVf$ between a current I, a maximum capacity C, a voltage V, and an operating frequency f Using this relation, the maximum capacity for a clock buffer is determined for each frequency. The maximum capacity values thus calculated are stored as second file 6 in storage 1.

Figure 2:
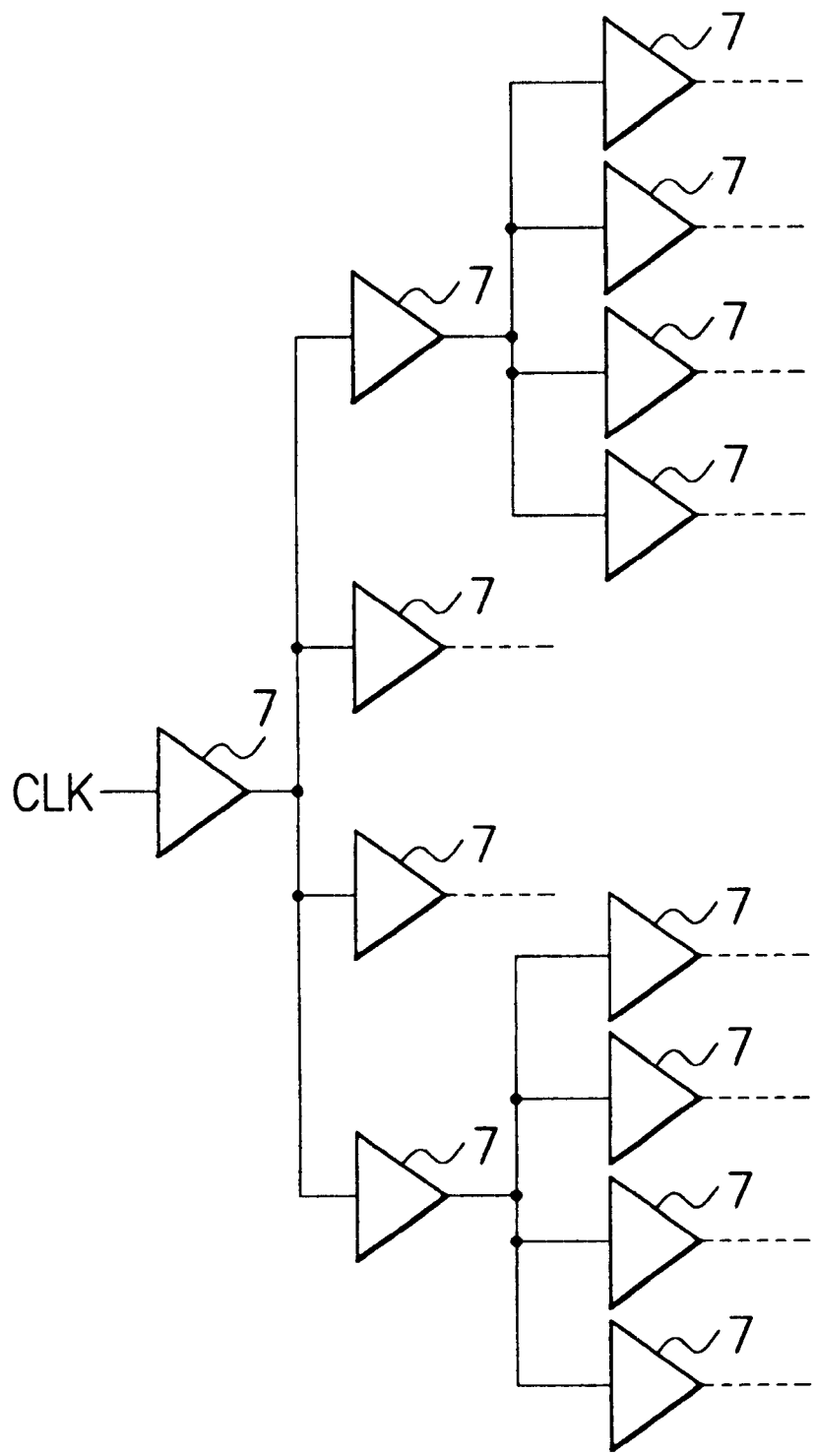
FIG. 2 is a schematic circuit diagram for explaining clock buffers connected by the first embodiment of the wiring apparatus of FIG. 1.

Wiring tool 4 is a layout tool to distribute a clock signal. Namely, wiring tool 4 connects a plurality of clock buffers or inverters 7 in a tree structure as shown in FIG. 2 and equalizes delay values of clock buffers 7 ranging from a root to an end leaf of the tree. Tool 4 conducts wiring of clock buffers 7 assuming that the maximum available capacity from determining device 2 is the limiting value of the maximum capacity which can be added to each buffer 7. The wiring width ordinarily used is set to a minimum line width allowed in designing rules by giving precedence to wiring efficiency in general.

In the first embodiment of the present invention, an optimal maximum capacity can be set for an operating frequency while guaranteeing reliability with respect to electro-migration. Therefore, a larger capacity can be added to each buffer when compared with the apparatus of the prior art. This minimizes the number of stages of the tree of clock buffers in the first embodiment. This advantageously reduces the wiring cost and power consumption in operation of the apparatus.

Figure 3:
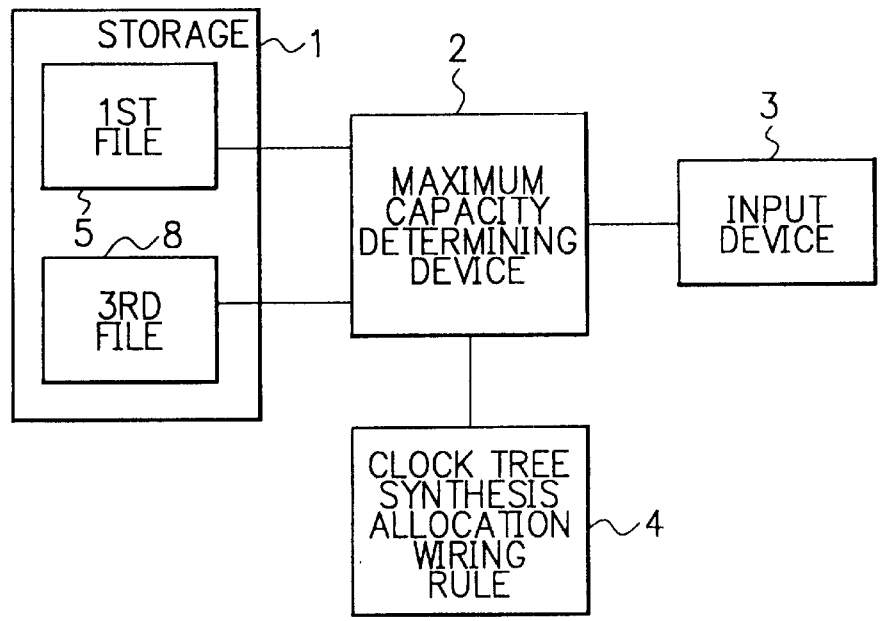
FIG. 3 is a block diagram showing a second embodiment of an apparatus for clock tree synthesis allocation wiring in accordance with the present invention.

Referring now to the drawings, description will be given in detail of a second embodiment in accordance with the present invention. In the second embodiment, the same constituent components as those of the first embodiment are assigned with the same reference numerals. The wiring apparatus of the second embodiment includes, as can be seen from FIG. 3, a storage 1, a maximum capacity determining device 2, an input device 3, and a tool for clock tree synthesis allocation wiring 4. Storage 1 includes a first file 5 and a third file 8. Third file 8 stores therein information of a maximum capacity allowed for a clock buffer for each operating frequency obtained according to restriction of hot carrier degradation. Third file 8 is prepared as follows. When a reliability guarantee period requested by a circuit or a system is determined, a maximum capacity which can be added to a clock buffer can be uniquely determined, to guarantee reliability with respect to hot carriers, by using a calculation formula released from a quality guarantee division. Information of the maximum capacity values determined according to restrictions of hot carriers for the respective operation frequencies is stored as third file 8 in the storage 1.

Maximum capacity determining device 2 determines a maximum available capacity for an operating frequency in accordance with information of the operating frequency supplied from input device 3, information of operating frequencies stored in first file 5, and information of maximum capacity values stored in third file 8. Wiring tool 4 conducts wiring by setting the maximum available capacity from determining device 2 to the limiting value of the maximum capacity which can be added to each block buffer.

In accordance with the second embodiment of the present invention, there can be set an optimal maximum capacity for an operating frequency while guaranteeing reliability with respect to hot carrier degradation. Consequently, the capacity which can be added to each buffer can be increased when compared with the apparatus of the prior art. Therefore, the number of stages of the tree of clock buffers can be decreased in the second embodiment, which leads to advantages of reduction in the wiring cost and minimization of power consumption in operation of the apparatus.

Figure 4:
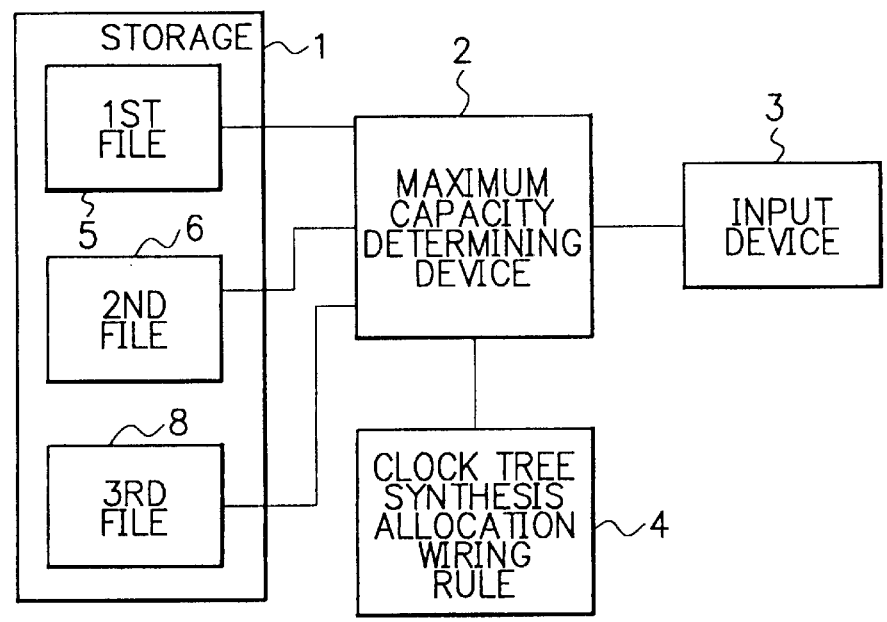
FIG. 4 is a block diagram showing a third embodiment of an apparatus for clock tree synthesis allocation wiring in accordance with the present invention.

Description will now be given in detail of a third embodiment of the present invention by referring now to the drawings. In the third embodiment, the same constituent components as those of the first and second embodiments are assigned with the same reference numerals. As shown in FIG. 4, the wiring apparatus of the third embodiment includes a storage 1, a maximum capacity determining device 2, an input device 3, and a tool for clock tree synthesis allocation wiring 4. Storage 1 includes a first file 5, a second file 6, and a third file 8.

Maximum capacity determining device 2 determines a maximum available capacity for an operating frequency in accordance with information of the operating frequency supplied from input device 3, information of operating frequencies stored in first file 5, and information of maximum capacity values stored in second and third files 6 and 8. In the determination, device 2 selects a smaller one of the maximum capacity values stored in second and third files 6 and 8. Wiring tool 4 conducts wiring under a condition that the maximum available capacity from determining device 2 is the limiting value of the maximum capacity which can be added to each block buffer.

In the third embodiment of the present invention, an optimal maximum capacity can be determined for an operating frequency used while guaranteeing reliability with respect to electro-migration and hot carrier degradation. In consequence, it is possible to add a larger capacity to each buffer when compared with the apparatus of the prior art. This increases the number of stages of the tree of clock buffers in the third embodiment. There are hence obtained advantages of reduction in the wiring cost and power consumption in operation of the apparatus.

In the embodiments above, it is favorable that wiring tool 4 achieves wiring with a fixed line with. However, when wiring tool 4 has a function to freely conduct wiring for a particular net by automatically changing the line width, it is only necessary to prepare a file to store therein for each line width a maximum capacity value which can be added to a clock driver determined according to, for example, the restriction of electro-migration. It is then advantageously possible to automatically and easily accomplish a complex quality guaranteeing operation while using various wiring types.

In accordance with the present invention, there can be set an optimal maximum capacity for an operating frequency while guaranteeing reliability with respect to electro-migration as well as hot carrier degradation. It is consequently possible to achieve an appropriate wiring operation and there can be attained advantages of reduction in the wiring cost and minimization of power consumption in operation of the apparatus.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An apparatus for clock tree synthesis allocation wiring, comprising:

a storage including a first file in which information of operating frequencies of clock lines is stored and a second file in which information of a maximum capacity allowed for a clock buffer for each operating frequency obtained according to restriction of electro-migration is stored;

a maximum capacity determining device connected to the storage;

an input device for inputting therefrom to the maximum capacity determining device information of operating frequencies to be used; and a tool for clock tree synthesis allocation wiring connected to the maximum capacity determining device, the maximum capacity determining device determining a maximum available capacity allowed for each of the operating frequencies according to information of the operating frequency from the input device, information of the operating frequencies stored in the first file, and information of the maximum capacity stored in the second file, the wiring tool conducting wiring by assuming the maximum available capacity to be a limiting value of a maximum capacity which can be added to each clock buffer.

2. An apparatus for clock tree synthesis allocation wiring, comprising:

a storage including a first file in which information of operating frequencies of clock lines is stored and a second file in which information of a maximum capacity allowed for a clock buffer for each operating frequency obtained according to restriction of hot carrier degradation is stored;

a maximum capacity determining device connected to the storage;

an input device for inputting therefrom to the maximum capacity determining device information of operating frequencies to be used; and a tool for clock tree synthesis allocation wiring connected to the maximum capacity determining device, the maximum capacity determining device determining a maximum available capacity allowed for each of the operating frequencies according to information of the operating frequency from the input device, information of the operating frequencies stored in the first file, and information of the maximum capacity stored in the second file, the wiring tool conducting wiring by assuming the maximum available capacity to be a limiting value of a maximum capacity which can be added to each clock buffer.

3. An apparatus for clock tree synthesis allocation wiring, comprising:

a storage including a first file in which information of operating frequencies of clock lines is stored, a second file in which information of a maximum capacity allowed for a clock buffer for each operating frequency obtained according to restriction of electro-migration is stored, and a third file in which information of a maximum capacity allowed for a clock buffer for each operating frequency obtained according to restriction of hot carrier degradation is stored;

a maximum capacity determining device connected to the storage;

an input device for inputting therefrom to the maximum capacity determining device information of operating frequencies to be used; and a tool for clock tree synthesis allocation wiring connected to the maximum capacity determining device, the maximum capacity determining device determining a maximum available capacity allowed for each of the operating frequencies according to information of the operating frequency from the input device, information of the operating frequencies stored in the first file, and information of the maximum capacity stored in the second and third files, the wiring tool conducting wiring by assuming the maximum available capacity to be a limiting value of a maximum capacity which can be added to each clock buffer.

4. A method of clock tree synthesis allocation wiring for use with an apparatus for clock tree synthesis allocation wiring, the apparatus comprising:

a storage including a first file in which information of operating frequencies of clock lines is stored and a second file in which information of a maximum capacity allowed for a clock buffer for each operating frequency obtained according to restriction of electro-migration is stored;

a maximum capacity determining device connected to the storage;

an input device for inputting therefrom in the maximum capacity determining device information of operating frequencies to be used; and a tool for clock tree synthesis allocation wiring connected to the maximum capacity determining device, the method comprising the steps of:

inputting by the input device information of operating frequencies to be used, to the maximum capacity determining device;

determining by the maximum capacity determining device a maximum available capacity allowed for each of the operating frequencies according to information of the operating frequency from the input device, information of the operating frequencies stored in the first file, and information of the maximum capacity stored in the second file, and wiring by the wiring tool by assuming the maximum available capacity to be a limiting value of a maximum capacity which can be added to each clock buffer.

5. A method of clock tree synthesis allocation wiring for use with an apparatus for clock tree synthesis allocation wiring, the apparatus comprising:

a storage including a first file in which information of operating frequencies of clock lines is stored and a second file in which information of a maximum capacity allowed for a clock buffer for each operating frequency obtained according to restriction of hot carrier degradation is stored;

a maximum capacity determining device connected to the storage;

an input device for inputting therefrom in the maximum capacity determining device information of operating frequencies to be used; and a tool for clock tree synthesis allocation wiring connected to the maximum capacity determining device, the method comprising the steps of:

inputting by the input device information of operating frequencies to be used, to the maximum capacity determining device;

determining by the maximum capacity determining device a maximum available capacity allowed for each of the operating frequencies according to information of the operating frequency from the input device, information of the operating frequencies stored in the first file, and information of the maximum capacity stored in the second file, and wiring by the wiring tool by assuming the maximum available capacity to be a limiting value of a maximum capacity which can be added to each clock buffer.

6. A method of clock tree synthesis allocation wiring for use with an apparatus for clock tree synthesis allocation wiring, the apparatus comprising:

a storage including a first file in which information of operating frequencies of clock lines is stored, a second file in which information of a maximum capacity allowed for a clock buffer for each operating frequency obtained according to restriction of electro-migration is stored, and a third file in which information of a maximum capacity allowed for a clock buffer for each operating frequency obtained according to restriction of hot carrier degradation is stored;

a maximum capacity determining device connected to the storage;

an input device for inputting therefrom in the maximum capacity determining device information of operating frequencies to be used; and a tool for clock tree synthesis allocation wiring connected to the maximum capacity determining device, the method comprising the steps of:

inputting by the input device information of operating frequencies to be used, to the maximum capacity determining device;

determining by the maximum capacity determining device a maximum available capacity allowed for each of the operating frequencies according to information of the operating frequency from the input device, information of the operating frequencies stored in the first file, and information of the maximum capacity stored in the second and third files, and wiring by the wiring tool by assuming the maximum available capacity to be a limiting value of a maximum capacity which can be added to each clock buffer.

* * * * *